US012757737B2

(12) United States Patent
Chuang et al.

(10) Patent No.: US 12,757,737 B2
(45) Date of Patent: Oct. 6, 2026

(54) SHIELDING FOR REDUCING ELECTROMAGNETIC INTERFERENCE AND MAGNETIC INTERFERENCE AND METHODS FOR FORMING THE SAME

(71) Applicant: Taiwan Semiconductor Manufacturing Company Limited, Hsinchu (TW)

(72) Inventors: Harry-Hak-Lay Chuang, Zhubei city (TW); Yuan-Jen Lee, Hsinchu (TW); Kuo-An Liu, Hsinchu City (TW); Ching-Huang Wang, Pingjhen City (TW); C.T. Kuo, Hsinchu City (TW); Tien-Wei Chiang, Taipei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 603 days.

(21) Appl. No.: 18/303,659

(22) Filed: Apr. 20, 2023

(65) Prior Publication Data

US 2024/0096818 A1 Mar. 21, 2024

Related U.S. Application Data

(60) Provisional application No. 63/408,033, filed on Sep. 19, 2022.

(51) Int. Cl.

| | |
|---|---|
| ***H10B 80/00*** | (2026.01) |
| ***H10B 61/00*** | (2023.01) |
| ***H10W 42/20*** | (2026.01) |
| ***H10W 90/00*** | (2026.01) |

(52) U.S. Cl.
CPC ............ *H10W 42/20* (2026.01); *H10B 80/00* (2023.02); *H10W 90/00* (2026.01); *H10B 61/00* (2023.02)

(58) Field of Classification Search
CPC ... H01L 23/552; H01L 25/0655; H01L 25/50; H10B 80/00
See application file for complete search history.

(56) References Cited

U.S. PATENT DOCUMENTS

| | | | | |
|---|---|---|---|---|
| 12,308,346 | B2 * | 5/2025 | Wang | H10P 54/00 |
| 12,356,693 | B2 * | 7/2025 | Lin | H10D 84/038 |
| 2021/0134724 | A1 * | 5/2021 | Rubin | H10W 70/611 |
| 2022/0344578 | A1 * | 10/2022 | Chuang | H10N 50/80 |

(Continued)

FOREIGN PATENT DOCUMENTS

| | | | | |
|---|---|---|---|---|
| EP | 4187451 A1 * | 5/2023 | | H10W 42/287 |
| WO | WO-2023103716 A1 * | 6/2023 | | H01L 23/3135 |

*Primary Examiner* — Walter L Lindsay, Jr.
(74) *Attorney, Agent, or Firm* — The Marbury Law Group, PLLC

(57) ABSTRACT

Devices and method for forming a shielding assembly including a first chip package structure sensitive to magnetic interference (MI), a second chip package structure sensitive to electromagnetic interference (EMI), and a shield surrounding sidewalls and top surfaces of the first chip package structure and the second chip package structure, in which the shield is a magnetic shielding material. In some embodiments, the shield may include silicon steel, in some embodiments, the shield may include Mu-metal. The silicon-steel-based or Mu-metal-based shield may provide both EMI and MI protection to multiple chip package structures with various susceptibilities to EMI and MI.

20 Claims, 11 Drawing Sheets

(56) References Cited

U.S. PATENT DOCUMENTS

| | | | | |
|---|---|---|---|---|
| 2023/0056509 | A1* | 2/2023 | Rajoo | H10D 1/20 |
| 2024/0079381 | A1* | 3/2024 | Yu | H10W 70/635 |
| 2024/0096818 | A1* | 3/2024 | Chuang | H10N 50/80 |

* cited by examiner

SHIELDING FOR REDUCING ELECTROMAGNETIC INTERFERENCE AND MAGNETIC INTERFERENCE AND METHODS FOR FORMING THE SAME

RELATED APPLICATIONS

This application claims priority from U.S. Provisional Application Ser. No. 63/408,033 entitled "Improved Shielding For Reducing Electromagnetic Interference And Magnetic Interference And Methods For Forming The Same," filed on Sep. 19, 2022, the entire contents of which are incorporated herein by reference for all purposes.

BACKGROUND

Semiconductor dies within chip package structures are becoming increasingly complex, implementing various devices that are susceptible to magnetic interference (MI) and/or electromagnetic interference (EMI). Generally, devices with EMI-susceptible components include EMI shielding to protect against RF radiation that is prevalent throughout various environments such as environments with electrically-operated technology. However, the same EMI-susceptible components or other adjacent components within a same device may also be susceptible to MI, requiring additional and separate shielding to mitigate against MI. Additional shielding to protect against MI may take up additional design space within a device, or may not be implemented at all due to lack of available design space, especially in smaller user equipment such as wearable devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a vertical cross-sectional view and FIG. 3B is a horizontal cross-sectional view along the horizontal plane B-B' of FIG. 3A.

FIG. 4A is a vertical cross-sectional view and FIG. 4B is a horizontal cross-sectional view along the horizontal plane C-C' of FIG. 4A.

DETAILED DESCRIPTION

Figure 1A:
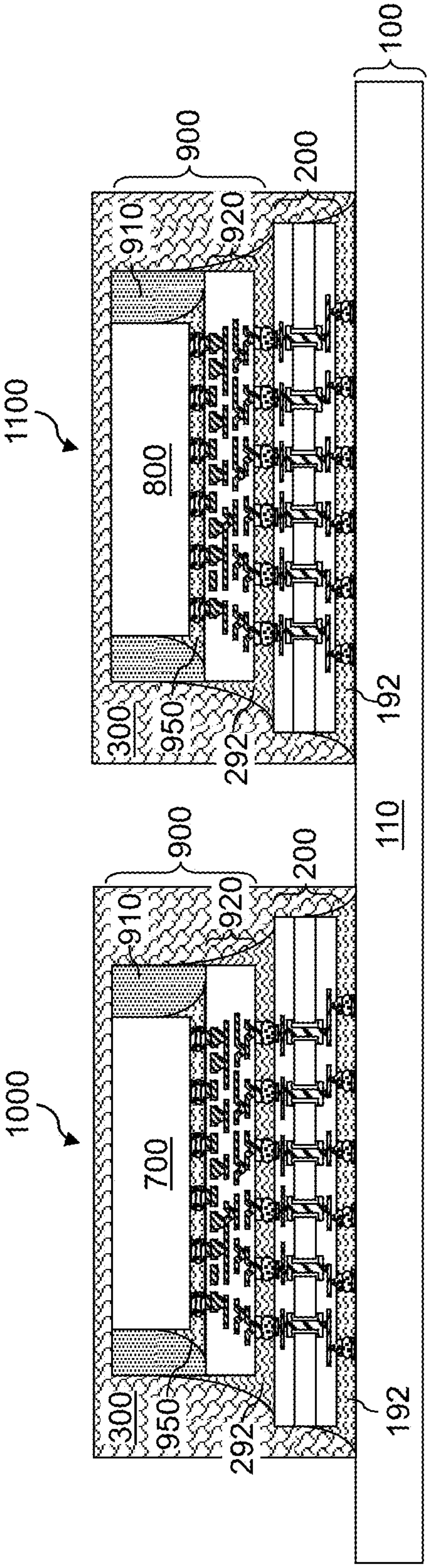
FIG. 1A is a vertical cross-sectional view of a region of a chip package assembly including a printed circuit board and chip package structures that each include package substrates and fan-out packages according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments of the present disclosure are directed to shielding assemblies, and particularly to board-level shields encapsulating multiple devices on a printed circuit board (PCB) and package levels shields within chip package structures. Generally, the various embodiment methods and structures may include a chip package structure such as a fan-out wafer level package (FOWLP) and fan-out panel level package (FOPLP). While the various embodiments of the present disclosure are described using an FOWLP configuration, implementation of the various embodiment methods and structures in an FOPLP configuration or any other fan-out package configuration are within the contemplated scope of disclosure.

The various embodiment shielding assemblies structures may include a shield having sidewalls and a ceiling or ceiling portions having a same thickness or different thicknesses. An embodiment shield may be formed and positioned to encapsulate multiple devices, such as board level devices, that are susceptible to magnetic interference (MI) and electromagnetic interference (EMI). Various embodiments may include a shield that is comprised of silicon steel (Si steel) and/or Mu-metal. Mu-metal is a soft magnetic alloy with high magnetic permeability that provides for a low reluctance (magnetic resistance) path for magnetic flux. Shielding made with high-permeability alloys such as Mu-metal function by providing a path for the magnetic field lines around the shielded area. Silicon (Si) steel, also referred to as electrical steel, are ferritic alloys of iron and silicon that have magnetic properties. The silicon embedded within Si steel may improve magnetic softness and increase the electrical resistivity. Si steel has high saturation magnetization that is useful in protecting against MI from strong external magnetic flux density, and Mu-metals have high permeability that is useful in protecting against EMI in high-frequency applications. Various embodiments may be used in place of conventional shielding which protects against either EMI or MI, but not both. In this manner, the various embodiment shields may replace multiple shields or multiple shield layers used to separately protect against both MI and EMI with one single shield that may protect multiple devices from both MI and EMI.

Figure 1B:
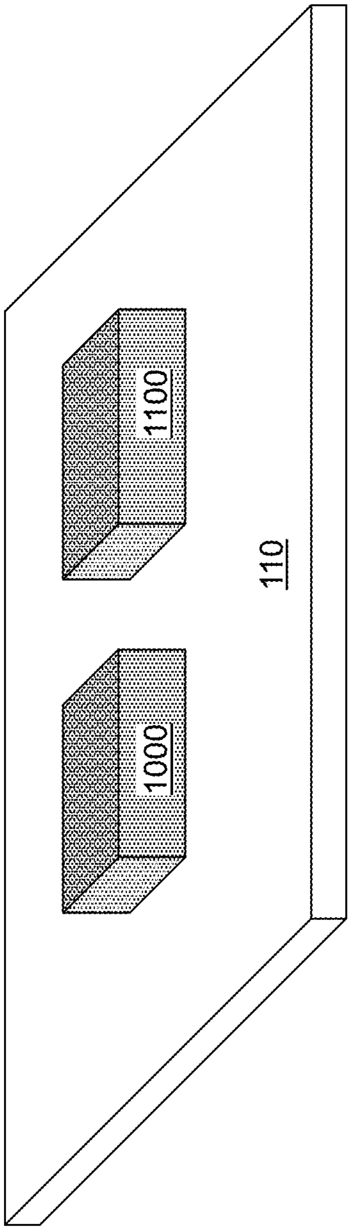
FIG. 1B is a simplified three-dimensional perspective view of the chip package assembly of FIG. 1A

FIG. 1A is a vertical cross-sectional view of a region of a chip package assembly including a printed circuit board and chip package structures that each include package substrates and fan-out packages according to an embodiment of the present disclosure. FIG. 1B is a simplified three-dimensional perspective view of the chip package assembly of FIG. 1A. Referring to FIGS. 1A and 1B, a chip package structure 1000 and a chip package structure 1100 may each include a package substrate 200 affixed to a printed circuit board 100, and a fan-out package 900 affixed to the package substrate 200. Various components of the chip package structure 1000 including the semiconductor die 700 are described herein. However, the following description may similarly be applied to the chip package structure 1100 including the semiconductor die 800, such that the chip package structure 1100 may include the same or similar components as the chip package structure 1000, and the components of the chip package structure 1100 may be formed in a same or similar manner as the components of the chip package structure 1000.

Referring to FIG. 1A, the fan-out package 900 may include a redistribution structure 920 (also referred to as an interposer) including redistribution-side metal pad structures, redistribution dielectric layers, and redistribution wiring interconnects. The fan-out package 900 may further include at least one semiconductor die 700 comprising a respective set of die-side metal pad structures that are attached to the redistribution-side metal pad structures through a respective set of solder material portions, thereby electrically connecting the semiconductor die 700 to the redistribution dielectric layers and redistribution wiring interconnects of the redistribution structure 920. A first underfill material portion 950 may laterally surround the redistribution-side metal pad structures and the die-side metal pad structures of the semiconductor die 700, and may surround sidewalls of the at least one semiconductor die 700.

The first underfill material portion 950 may also be referred to as microbump underfill fillet portions or microbump underfill material portions. The first underfill material portion 950 may be formed by injecting the first underfill material around a respective array of solder material portions positioned between the semiconductor die 700 and the redistribution structure 920. In some embodiments, the outer periphery of the first underfill material portion 950 may have squared, or perpendicular corners in a plan view. The first underfill material portion 950 may laterally surround, and contact, each of the solder material portions within the unit area UA. The first underfill material portion 950 may be formed around, and contact, the solder material portions, redistribution-side metal pad structures, and die-side metal pad structures positioned between the semiconductor die 700 and the redistribution structure 920. In some embodiments, the exposed outermost surfaces of the first underfill material portion 950 surrounding sidewalls of the semiconductor die 700 may have a curved or concave shape with varying taper angles formed as a result of the deposition process. In other embodiments, the exposed outermost surfaces of the first underfill material portion 950 surrounding sidewalls of the semiconductor die 700 may have a straight, tapered, or convex shape.

The fan-out package 900 may further include a molding compound die frame 910 laterally surrounding the semiconductor die 700 formed from a molding compound material. In one embodiment, the molding compound die frame 910 may include sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die 700 after formation of the first underfill material portion 950 within the fan-out package 900. The molding compound material contacts a peripheral portion of a planar surface of the redistribution structure 920.

Fan-out bonding pads may be formed on the opposite side of the redistribution structure 920 from the semiconductor die 700. Each redistribution structure 920 may comprise redistribution dielectric layers, redistribution wiring interconnects embedded in the redistribution dielectric layers, and fan-out bonding pads. The fan-out bonding pads may be located on an opposite side of the redistribution structure 920 from the redistribution-side metal pad structures relative to the redistribution dielectric layers (i.e. positioned between the redistribution structure 920 and the package substrate 200). Solder material portions may be attached to the fan-out bonding pads. The package substrate 200 may be bonded to the fan-out package 900 through the solder material portions on the bottom side of the redistribution structure 920. The package substrate 200 may be a cored package substrate including a core substrate, or a coreless package substrate that does not include a package core. Alternatively, the package substrate 200 may include a system-on-integrated package substrate (SoIS) including redistribution layers and/or dielectric interlayers, at least one embedded interposer (such as a silicon interposer). Such a system-integrated package substrate may include layer-to-layer interconnections using bonding material portions, underfill material portions (such as molded underfill material portions), and/or an optional adhesion film (not shown). While the present disclosure is described using a substrate package, it is understood that the scope of the present disclosure is not limited by any particular type of substrate package and may include an SoIS. Other substrate packages are within the contemplated scope of disclosure. An array of through-core via structures including a metallic material may be provided in the through-plate holes. Each through-core via structure may, or may not, include a cylindrical hollow therein. Optionally, dielectric liners may be used to electrically isolate the through-core via structures from the core substrate.

The package substrate 200 may include board-side surface laminar circuit (SLC) and a chip-side surface laminar circuit (SLC). The board-side SLC may include board-side insulating layers embedding board-side wiring interconnects. The chip-side SLC may include chip-side insulating layers embedding chip-side wiring interconnects. The board-side insulating layers and the chip-side insulating layers may include a photosensitive epoxy material that may be lithographically patterned and subsequently cured. The board-side wiring interconnects and the chip-side wiring interconnects may include copper that may be deposited by electroplating within patterns in the board-side insulating layers or the chip-side insulating layers.

The package substrate 200 may include a chip-side surface laminar circuit including chip-side wiring interconnects connected to an array of chip-side bonding pads that may be bonded to the array of solder material portions connected to the redistribution structure 920, and a board-side surface laminar circuit including board-side wiring interconnects connected to an array of board-side bonding pads. The array of board-side bonding pads may be configured to allow bonding through solder balls. The array of chip-side bonding pads may be configured to allow bonding through C4 solder balls. Generally, any type of package substrate 200 may be used. While the present disclosure is described using an embodiment in which the package substrate 200 includes a chip-side surface laminar circuit and a board-side surface laminar circuit, embodiments are expressly contemplated herein in which one of the chip-side surface laminar circuit and the board-side surface laminar circuit is omitted, or is replaced with an array of bonding structures such as microbumps. In an illustrative example, the chip-side surface laminar circuit may be replaced with an array of microbumps or any other array of bonding structures.

The solder material portions attached to the fan-out bonding pads of the fan-out package 900 may be disposed on the array of the chip-side bonding pads of the package substrate 200. A reflow process may be performed to reflow the solder material portions, thereby inducing bonding between the fan-out package 900 and the package substrate 200. In one embodiment, the solder material portions may include C4 (controlled collapse of chip connection) solder balls, and the fan-out package 900 may be attached to the package substrate 200 using an array of C4 solder balls.

A second underfill material portion 292 may be formed around the solder material portions positioned between the fan-out package 900 and the package substrate 200 by applying and shaping a second underfill material. The second underfill material portion 292 may be formed by injecting the second underfill material around the array of solder material portions between the fan-out package 900 and the package substrate 200 after the solder material portions are reflowed. Any known underfill material application method may be used, which may be, for example, the capillary underfill method, the molded underfill method, or the printed underfill method. The second underfill material portion 292 may be formed between the redistribution structure 920 and the package substrate 200, and may contact vertical sidewalls of the fan-out package 900. According to an aspect of the present disclosure, the second underfill material portion 292 may be formed directly on each sidewall of the molding compound die frame 910.

In one embodiment, the second underfill material portion 292 may include tapered sidewalls that extend continuously from a respective sidewall of the molding compound die frame 910 to a planar surface (such as the top surface) of the package substrate 200. The taper angle of the tapered sidewalls may be in a range from 10 degrees to 80 degrees, such as from 30 degrees to 60 degrees, although lesser and greater taper angles may also be used. The taper angle may, or may not, be uniform. For example, exposed outermost surfaces of the second underfill material portion 292 surrounding vertical sidewalls of the fan-out package 900 may have a curved or concave shape with varying taper angles formed as a result of the deposition process. In one embodiment, the tapered sidewalls may have a same taper angle (as measured from a vertical direction) throughout.

The printed circuit board (PCB) 100 may include a PCB substrate 110 and PCB bonding pads may be provided. The PCB 100 includes a printed circuitry (not shown) at least on one side of the PCB substrate 110. An array of solder joints may be formed to bond the array of board-side bonding pads to the array of PCB bonding pads. The solder joints may be formed by disposing an array of solder balls between the array of board-side bonding pads and the array of PCB bonding pads, and by reflowing the array of solder balls. An underfill material portion 192 may be formed around the solder joints by applying and shaping an underfill material. Exposed outermost surfaces of the underfill material portion 192 surrounding vertical sidewalls of the package substrate 200 may have a curved or concave shape with varying taper angles formed as a result of the deposition process. The package substrate 200 may be attached to the PCB 100 through the array of solder joints.

The chip package structure 1000 may be formed by encapsulating and laterally surrounding the fan-out package 900, package substrate 200, and various underfill material portions (950, 292, 192) in a molding compound chip frame 300. In one embodiment, the molding compound chip frame 300 may include sidewalls that are vertically coincident with outermost portions of the underfill material portion 192, i.e., located within same vertical planes as the outermost portions of the underfill material portion 192. The molding compound chip frame 300 may be formed around the fan-out package 900, package substrate 200, and various underfill material portions (292, 192) after formation of the underfill material portion 192 after attaching the package substrate 200 to the PCB substrate 110. The molding compound material may contact a peripheral portion of a planar surface of the PCB substrate 110. In some embodiments, the molding compound chip frame 300 may include sidewalls that are vertically coincident with outermost portions of the package substrate 200, i.e., located within same vertical planes as the outermost sidewalls of the package substrate 200. The molding compound chip frame 300 may be formed around the fan-out package 900 and second underfill material portion 292, and the package substrate 200 may subsequently be attached to the PCB substrate 110. The molding compound material may contact a peripheral portion of a planar surface of the package substrate 200.

Each semiconductor die (700, 800) may include any semiconductor die known in the art, such as a system-on-a-chip (SoC) die, a memory die, and a radio frequency die. For example, as illustrated, the fan-out packages 900 of the chip package structures 1000 and 1100 include semiconductor dies 700, 800 respectively. Each semiconductor die 700, 800 may include an application processor die, a central processing unit die, or a graphic processing unit die, and/or a high bandwidth memory (HBM) die that includes a vertical stack of static random-access memory dies. In one embodiment, the semiconductor dies 700, 800 may include at least one SoC die and a high bandwidth memory die including a vertical stack of static random-access memory (SRAM) dies that are interconnected to one another through microbumps and are laterally surrounded by an epoxy molding material enclosure frame.

Figure 2A:
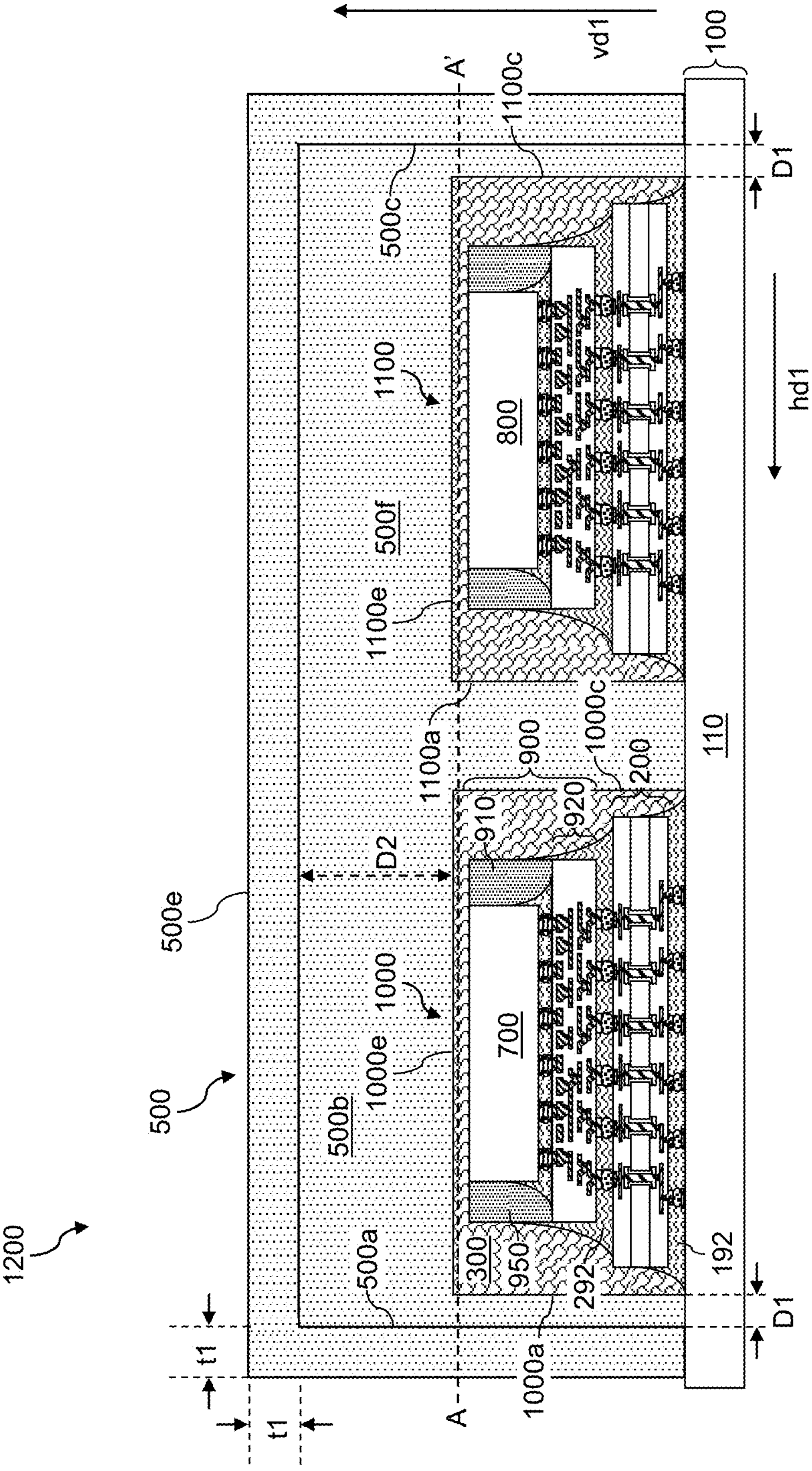
FIG. 2A is a vertical cross-sectional view of a region of a shielding assembly 1200 after attaching a shield according to an embodiment of the present disclosure.
Figure 2B:
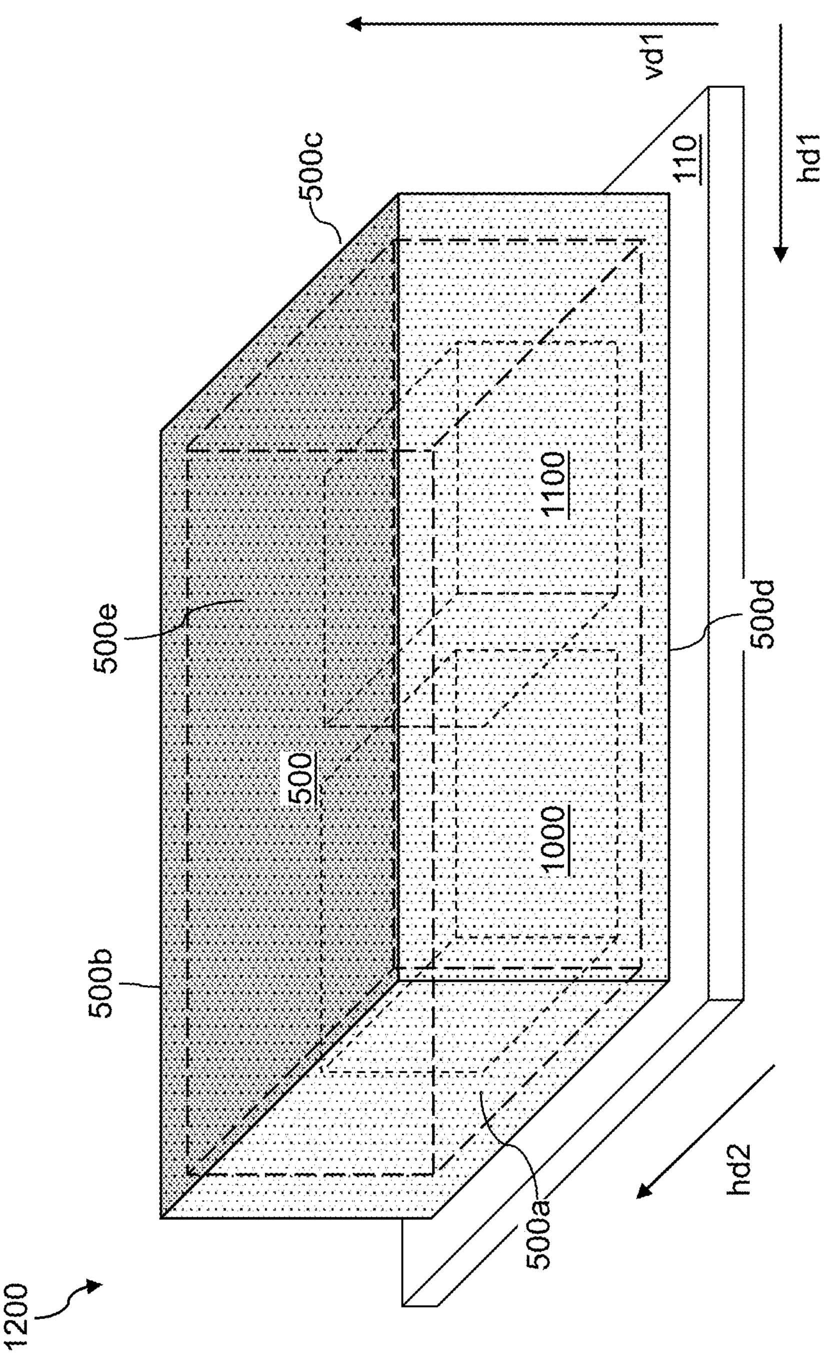
FIG. 2B is a simplified three-dimensional perspective view of the shielding assembly 1200 of FIG. 2A.
Figure 2C:
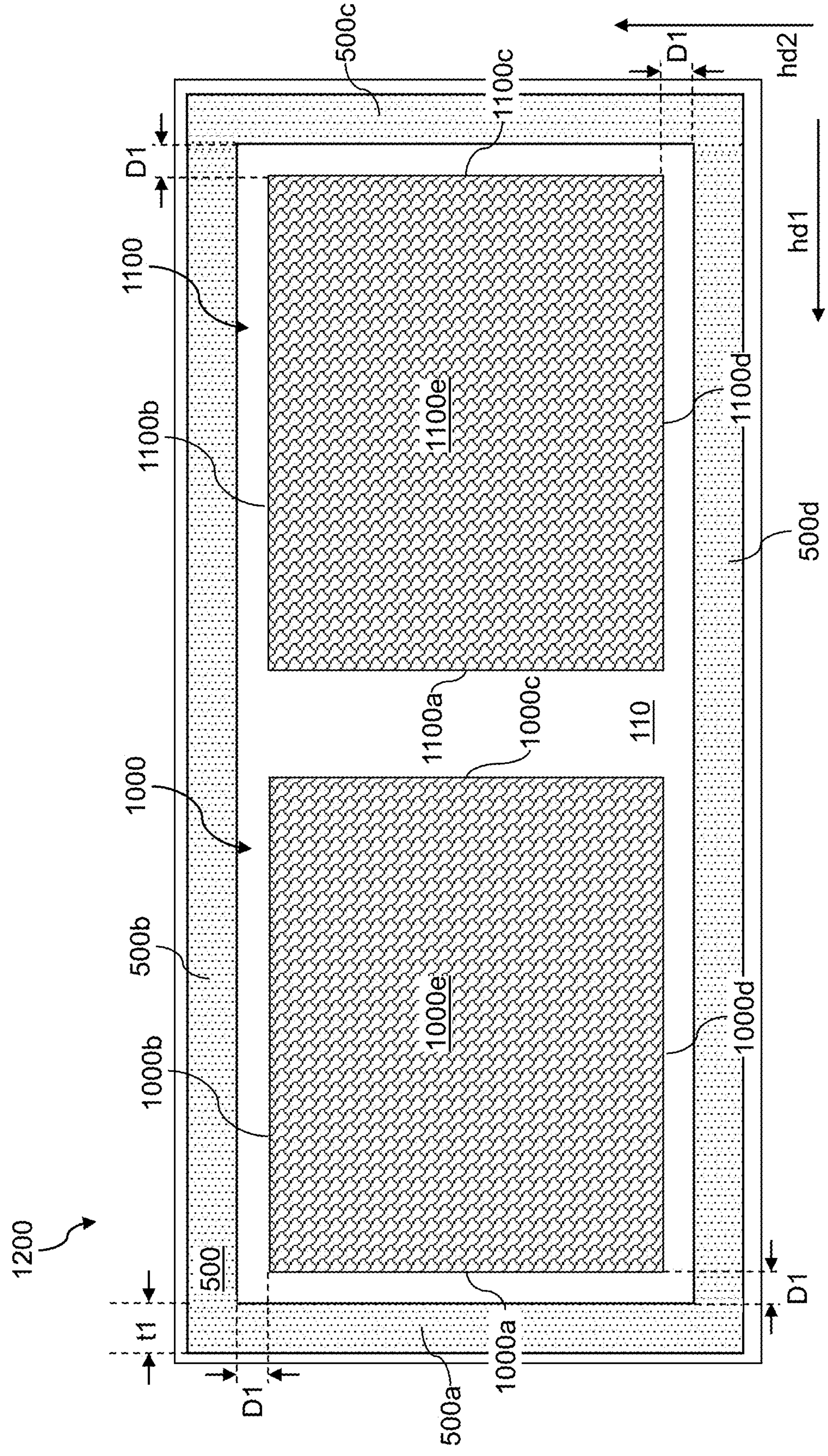
FIG. 2C is a horizontal cross-sectional view along the horizontal plane A-A' of FIG. 2A.

The chip package structures 1000, 1100 may be any active or passive device known in the art that may be implemented within a circuit design and mountable on or attachable to the PCB 100. The chip package structures 1000, 1100 may include devices or components that are susceptible to electromagnetic interference (EMI), such as radio frequency (RF) devices. For example, the semiconductor dies 700, 800 of the chip package structures 1000, 1100 may be wireless devices such as WiFi or BLE transmitters, receivers, or transceivers, or may be devices for receiving, transmitting, and processing wireless information. The chip package structures 1000, 1100 may include devices or components that are susceptible to magnetic interference (MI). For example, the semiconductor dies 700, 800 or other devices within the chip package structure 1000, 1100 may be magnetoresistive random-access memory (MRAM) and magnetoresistive sensors. The chip package structures 1000, 1100 may be different types of devices that are susceptible to various forms of interference. For example, the chip package structure 1000 may be an MRAM that is susceptible to MI, and the chip package structure 1100 may be an RF device that is susceptible to EMI. Thus, embodiments including various types of MI and/or EMI susceptible devices may benefit from shielding that protects against both MI and EMI. As shown in FIGS. 2A-2C, a shield 500 may be used in place of multiple board-level shields that are used in conventional implementations, therefore freeing up additional design space. The additional space saved by implementing the shield 500 may be especially beneficial in small devices such as wearable devices, in which component size and footprint minimization is a characteristic of the wearable device.

FIG. 2A is a vertical cross-sectional view of a region of a shielding assembly 1200 after attaching a shield according to an embodiment of the present disclosure. FIG. 2B is a simplified three-dimensional perspective view of the shielding assembly 1200 of FIG. 2A. The dashed lines as illustrated in FIG. 2B indicate the placement of the chip package structures 1000, 1100 within the shield as well as internal edges of the shield 500. FIG. 2C is a horizontal cross-sectional view along the horizontal plane A-A' of FIG. 2A. The shielding assembly 1200 may include a shield 500 and the chip package assembly including the chip package structures 1000, 1100 and the PCB 100.

Referring to FIGS. 2A-2C, a shield 500 may be positioned and affixed to the PCB substrate 110 to encapsulate the chip package structures 1000, 1100. The shield 500 may be attached or otherwise affixed to the PCB substrate 110 by any known means. For example, the shield 500 may be attached to the PCB substrate 110 via an adhesive layer between bottom surfaces of shield sidewalls 500*a*-500*d* (i.e., 500*a*, 500*b*, 500*c*, 500*d*) and a top surface of the PCB substrate 110. As another example, the shield 500 may include pins, rivets, clips, or other mechanisms extruding from bottom surfaces of the shield sidewalls 500*a*-500*d* that may be received by or otherwise grasped or hooked into corresponding holes or receptacles formed within the PCB substrate 110. As a further example, the PCB substrate 110 may be formed to include a metal solder ring to which the shield 500 may be soldered. As another further example, the shield 500 may be placed to encapsulate the chip package structures 1000, 1100, and a clamp or a can or chassis in combination with a clamp may be engaged to lock the shield 500 into place (i.e., bottom surfaces of the sidewalls 500*a*-500*d* are in contact with a top surface of the PCB substrate 110 or a top surface of a compressive receptor ring (e.g., rubber padded ring) positioned on the top surface of the PCB substrate 110). In some embodiments, the shield 500 may be soldered to a ground plane within the PCB 100 that is positioned beneath the chip package structures 1000, 1000, thereby creating a Faraday cage surrounding all sides of the chip package structures 1000, 1100.

The shield 500 may be formed using any known processes such as molding. The shield 500 may be formed to have sidewalls 500*a*, 500*b*, 500*c*, 500*d*, and a ceiling 500*e*. The sidewalls 500*a*-500*d* may be connected at proximate corners and may be connected to the ceiling 500*e* along top portions of the sidewalls 500*a*-500*d* such that an inverted well is formed within the confines of the sidewalls 500*a*-500*d* and the ceiling 500*e*. The shield 500 may be positioned over the chip package structures 1000, 1100 and bottom surfaces of the sidewalls 500*a*-500*d* may be in contact with a top surface of the PCB substrate 110 such that the chip package structures 1000, 1100 may be encapsulated by the sidewalls 500*a*-500*d* and the ceiling 500*e*.

The chip package structure 1000 may have sidewalls 1000*a*, 1000*b*, 1000*c*, 1000*d* and a top surface 1000*e*. The chip package structure 1100 may have sidewalls 1100*a*, 1100*b*, 1100*c*, 1100*d* and a top surface 1100*e*. The sidewall 500*a* may be proximate to and parallel with the sidewall 1000*a* of the chip package structure 1000, the sidewall 500*b* may be proximate to and parallel with both the sidewall 1000*b* and the sidewall 1100*b*, the sidewall 1000*c* may be proximate to and parallel with the sidewall 1100*a*, the sidewall 500*c* may be proximate to and parallel with the sidewall 1100*c*, the sidewall 500*d* may be proximate to and parallel with both the sidewall 1000*d* and the sidewall 1100*d*, and the ceiling 500*e* may be proximate to and parallel with both the top surface 1000*e* and the top surface 1100*e*.

The shield 500 may be positioned over the chip package structures 1000, 1100 such that the sidewalls 500*a*-500*d* of the shield 500 may be a distance D1 from proximate sidewalls 1000*a*, 1000*b*, 1000*d* of the chip package structure 1000 and may be the distance D1 from proximate sidewalls 1100*b*, 1100*c*, 1100*d* of the chip package structure 1100. The distance D1 may be greater than 0.01 millimeters, such as in a range of distances between 0.01 millimeters and 10 millimeters, although lesser or greater distances may be implemented. The shield 500 may be positioned over the chip package structures 1000, 1100 such that the ceiling 500*e* may be a distance D2 from proximate top surfaces 1000*e* and 1100*e* of the chip package structures 1000, 1100. The distance D2 may be greater than 0.1 millimeters, such as in a range of distances between 0.1 millimeters and 10 millimeters, although lesser or greater distances may be implemented.

The sidewalls 500*a*-500*d* and the ceiling 500*e* may have a thickness t1. In some embodiments, the thickness t1 may be greater than 0.1 millimeters, such as in a range of thickness between 0.1 millimeters and 1 millimeter, although lesser or greater distances may be used.

The shield 500 may be designed and/or formed prior to the fabrication and placement of the chip package structures 1000, 1100 on the PCB substrate 110 such that the lengths (i.e., in a first horizontal direction hd1 and a second horizontal direction hd2) and heights (i.e., in a vertical direction vd1) of the sidewalls 500*a*-500*d* and the ceiling 500*e* may be designed and/or formed with respect to the ultimate placements (i.e., on the PCB substrate 110), lengths, and heights of the chip package structures 1000, 1100 to create the distances D1 and D2.

In some embodiments, the shield 500 may be formed using magnetic shielding material such as a Mu-metal material or Silicon steel ("Si steel") material. In some embodiments implementing Mu-metal material to form the shield 500, the Mu-metal may be formed using nickel (Ni), iron (Fe), and at least one of copper (Cu), molybdenum (Mo), and chromium (Cr). For example, the shield 500 may be formed according to the chemical formula $Ni_aFe_bX_c$, in which "X" is Cu, Mo, or Cr, "a" is a number representing that the shield 500 consists of 70 to 80% Ni, "b" is a number representing that the shield 500 consists of 10 to 25% iron, and "c" is a number representing that the shield 500 consists of 0 to 5% X (i.e., 0 to 5% Cu, Mo, or Cr). In other words, the shield 500 formed using Mu-metal may include 70% to 80% Ni, 10% to 25% Fe, and less than or equal to 5% Cu, Mo, or Cr. In some embodiments, the shield 500 may be formed using other Mu-metal materials such as a permalloy material including 80% Ni and 20% Fe, an amunickel material including 48% Ni, a low carbon steel (LCS) material, an SPCC (cold rolled carbon steel sheets and strip) material, or an SPTE (steel plated-tin, electrolytic) material. In some embodiments implementing Si steel material to form the shield 500, the shield may include less than or equal to 6.5% silicon, with the remaining percentage portion being steel.

Implementing the shield 500 formed using Si steel or Mu-metal may allow for protections against both MI and EMI. Both Si steel and Mu-metal are soft magnetic materials that have high relative permeabilities (e.g., 4000 and 30,000 respectively) and high saturation magnetization that allow for protection against MI and EMI. A high relative permeability (e.g., greater than 10) allows for protection against EMI, while a high saturation magnetization can absorb and redirect magnetic flux density to protect against MI. Thus, implementing the shield 500 formed using Mu-metal or Si steel may protect the chip package structures 1000, 1100 from both MI and EMI. For example, the chip package structure 1000 may be an MRAM that is susceptible to MI, and the chip package structure 1100 may be an RF device that is susceptible to EMI. By encapsulating and/or surrounding the sidewalls 1000*a*-1000*d*, 1100*a*-1100*d* and top surfaces 1000*e*, 1100*e* of the chip package structures 1000, 1100 with the Mu-metal-based or Si steel-based shield 500, the shield 500 may protect the chip package structures 1000, 1100 from MI and EMI or may otherwise reduce the effect that MI and EMI has on the functionality of the chip package structures 1000, 1100. Shielding such as the shield 500 may be beneficial in circuit board designs with necessarily small footprints, such as wearable devices. For example, the shielding including Mu-metal or Si steel may encapsulate and protect multiple components that are susceptible to MI, EMI, or both, and may therefore replace two or more conventional board level shields that are separately covering devices or components with different susceptibilities (i.e., one Mu-metal shield 500 may be used in place of an MI shield covering an MRAM and an EMI shield covering an RF device). Thus, implementing a shield 500 may allow for the reduction in size of a shielding assembly (e.g., shielding assembly 1200).

Figure 3A:
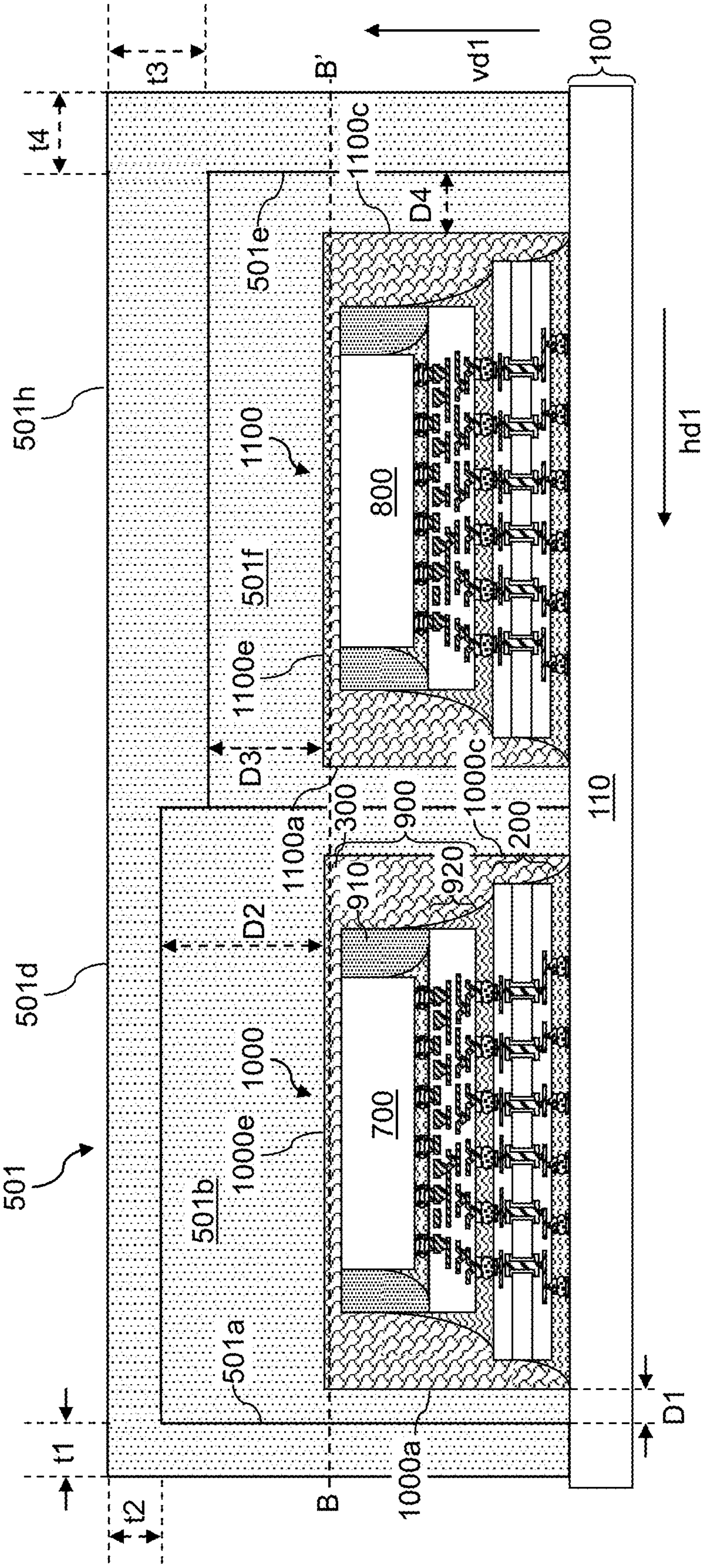
FIGS. 3A and 3B are various views of a first alternative structure after attaching a shield according to an embodiment of the present disclosure.
Figure 3B:
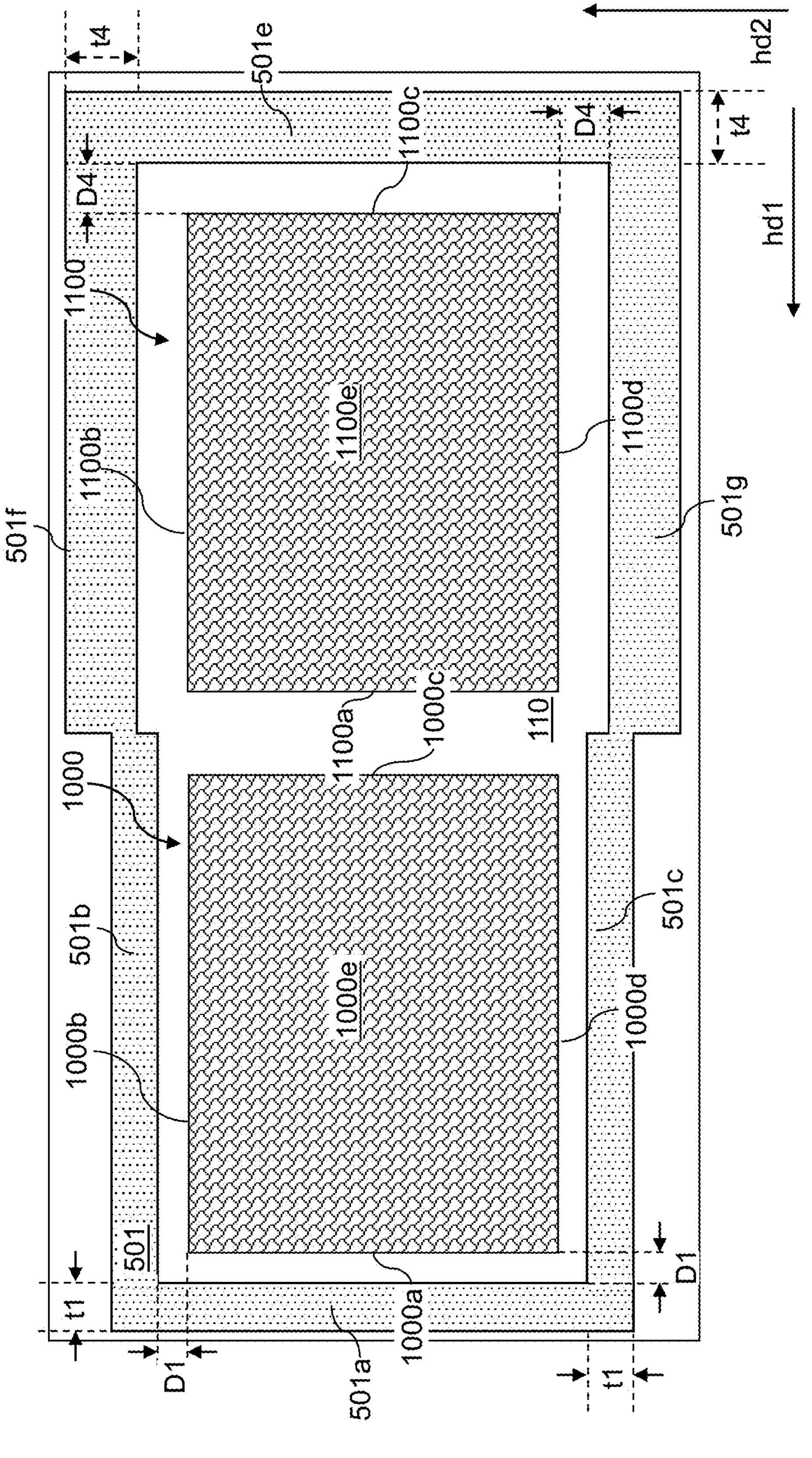

FIGS. 3A and 3B are various views of a first alternative structure after attaching a shield according to an embodiment of the present disclosure. FIG. 3A is a vertical cross-sectional view and FIG. 3B is a horizontal cross-sectional view along the horizontal plane B-B' of FIG. 3A. Referring to FIGS. 3A and 3B, a shield 501 may be formed to have various thicknesses (e.g., t1, t2, t3, t4) and positioned to have various distances (e.g., D1, D2, D3, D4) to the chip package structures 1000, 1100.

The shield 501 may be formed to have sidewalls 501*a*, 501*b*, 501*c*, 501*e*, 501*f*, 501g, and a ceiling including ceiling portions 501*d*, 501*h*. The sidewall 501*a* may be connected to the sidewalls 501*b* and 501*c* at proximate corners, the sidewall 501*e* may be connected to sidewalls 501*f* and 501g at proximate corners, the sidewalls 501*b* and 501*f* may be connected at a junction in which portions of at least one of the sidewalls 501*b* and 501*f* extrude beyond the width of the connected wall in the second horizontal direction hd2, the sidewalls 501*c* and 501g may be connected at a junction in which portions of at least one of the sidewalls 501*c* and 501*g* extrude beyond the width of the connected wall in the second horizontal direction hd2, the sidewalls 501*a*-501*c* may be connected to the ceiling portion 501*d* along top portions of the sidewalls 501*a*-501*c*, and the sidewalls 501*e*-501*g* may be connected to the ceiling portion 501*h* along top portions of the sidewalls 501*e*-501*g*. The shield 501 may be positioned over the chip package structures 1000, 1100 and bottom surfaces of the sidewalls 501*a*-501*c*, 501*e*-501*g* may be in contact with a top surface of the PCB substrate 110 such that the chip package structures 1000, 1100 may be encapsulated by the sidewalls 501*a*-501*c*, 501*e*-501*g*, and the ceiling portions 501*d*, 501*h*.

The chip package structure 1000 may have sidewalls 1000*a*, 1000*b*, 1000*c*, 1000*d* and a top surface 1000*e*. The chip package structure 1100 may have sidewalls 1100*a*, 1100*b*, 1100*c*, 1100*d* and a top surface 1100*e*. The sidewall 501*a* may be proximate to and parallel with the sidewall 1000*a* of the chip package structure 1000, the sidewall 501*b* may be proximate to and parallel with the sidewall 1000*b*, the sidewall 1000*c* may be proximate to and parallel with the sidewall 1100*a*, the sidewall 501*c* may be proximate to and parallel with the sidewall 1000*d*, and the ceiling portion 501*d* may be proximate to and parallel with the top surface 1000*e*. The sidewall 501*e* may be proximate to and parallel with the sidewall 1100*c* of the chip package structure 1100, the sidewall 501*f* may be proximate to and parallel with the sidewall 1100*b*, the sidewall 501g may be proximate to and parallel with the sidewall 1100*d*, and the ceiling portion 501*h* may be proximate to and parallel with the top surface 1100*e*.

The shield 501 may be positioned over the chip package structures 1000, 1100 such that the sidewalls 501*a*-501*c* of the shield 501 may be a distance D1 from proximate sidewalls 1000*a*, 1000*b*, 1000*d* of the chip package structure 1000. The distance D1 may be greater than 0.01 millimeters, such as in a range of distances between 0.01 millimeters and 5 millimeters, although lesser or greater distances may be implemented. The shield 501 may be positioned over the chip package structures 1000, 1100 such that the ceiling portion 501*d* may be a distance D2 from the proximate top surface 1000*e* of the chip package structure 1000. The distance D2 may be greater than 0.1 millimeters, such as in a range of distances between 0.1 millimeters and 10 millimeters, although lesser or greater distances may be implemented.

The shield 501 may be positioned over the chip package structures 1000, 1100 such that the sidewalls 501*e*-501*g* of the shield 501 may be a distance D4 from proximate sidewalls 1100*b*, 1100*c*, 1100*d* of the chip package structure 1100. The distance D4 may be greater than 0.1 millimeters, such as in a range of distances between 0.1 millimeters and 10 millimeters, although lesser or greater distances may be implemented. The shield 501 may be positioned over the chip package structures 1000, 1100 such that the ceiling portion 500*h* may be a distance D3 from the proximate top surface 1100*e* of the chip package structure 1100. The distance D3 may be greater than 0.1 millimeters, such as in a range of distances between 0.1 millimeters and 10 millimeters, although lesser or greater distances may be implemented. The distance D3 may be less than the distance D2. The distance D4 may be greater than the distance D1.

The sidewalls 501*a*-501*c* may have a thickness t1. In some embodiments, the thickness t1 may be greater than 0.1 millimeters, such as in a range of thicknesses between 0.1 millimeters and 1 millimeter, although lesser or greater distances may be used. The ceiling portion 501*d* may have a thickness t2. In some embodiments, the thickness t2 may be greater than 0.1 millimeters, such as in a range of thicknesses between 0.1 millimeters and 0.4 millimeters, although lesser or greater distances may be used. The sidewalls 501*e*-501*g* may have a thickness t4. In some embodiments, the thickness t4 may be greater than 0.2 millimeters, such as in a range of thicknesses between 0.2 millimeters and 1 millimeter, although lesser or greater distances may be used. The ceiling portion 501*h* may have a thickness t3. In some embodiments, the thickness t3 may be greater than 0.1 millimeters, such as in a range of thicknesses between 0.1 millimeters and 1 millimeter, although lesser or greater distances may be used. The thickness t1 may be less than the thickness t4. The thickness t2 may be less than the thickness t3.

The varied thicknesses t1-t4 and distances D1-D4 of the shield 501 may allow for optimized MI and EMI protection for every chip package structure (e.g., chip package structures 1000, 1100) encapsulated by the shield 501. For example, the chip package structure 1000 may be an MRAM that is susceptible to MI, and the chip package structure 1100 may be an RF device that is susceptible to EMI. The shield 501 may therefore be formed to have optimal and varied thicknesses and distances with respect to each of the chip package structures 1000, 1100 such that MI and EMI is regionally minimized within the shielding assembly.

Figure 4A:
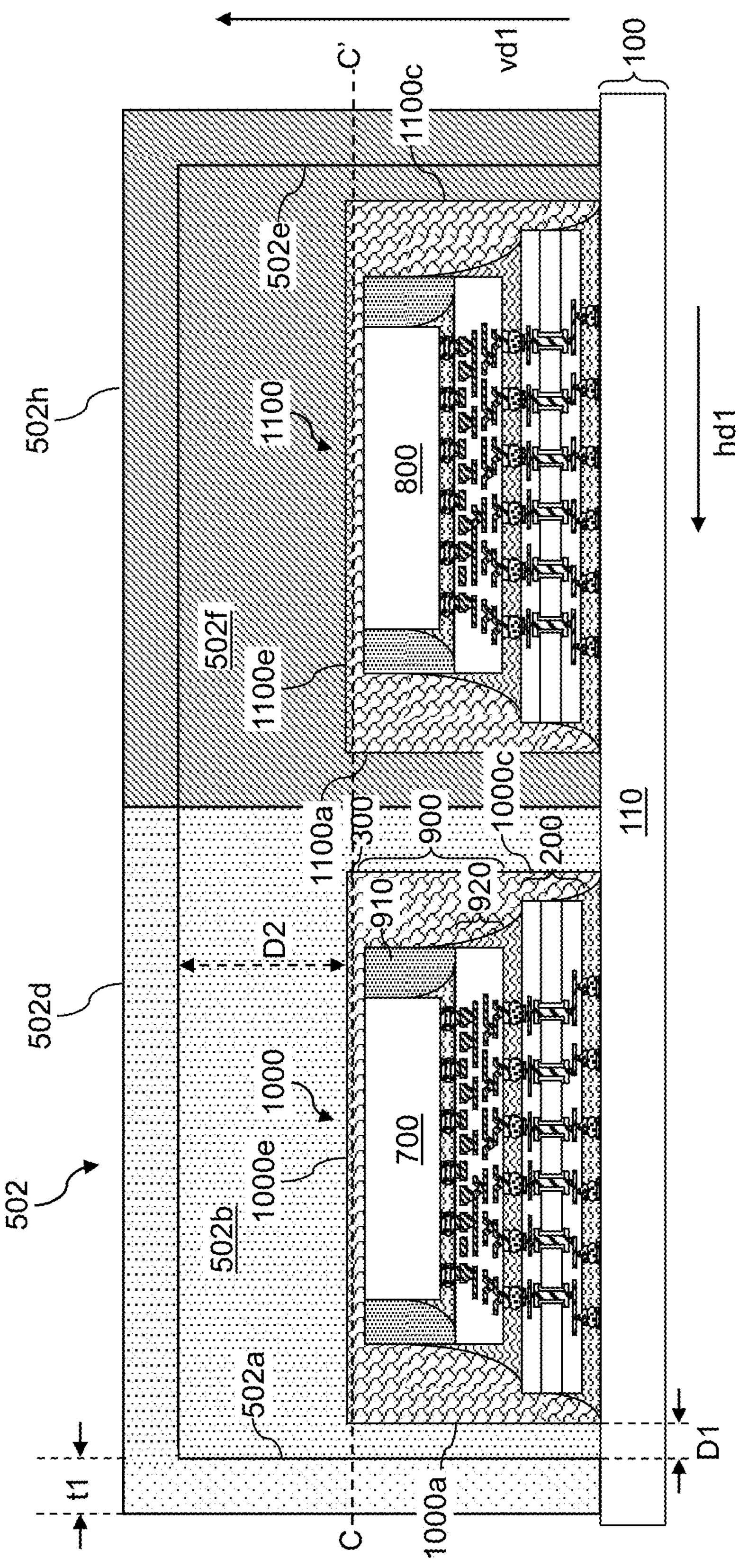
FIGS. 4A and 4B are various views of a second alternative structure after attaching a shield according to an embodiment of the present disclosure.
Figure 4B:
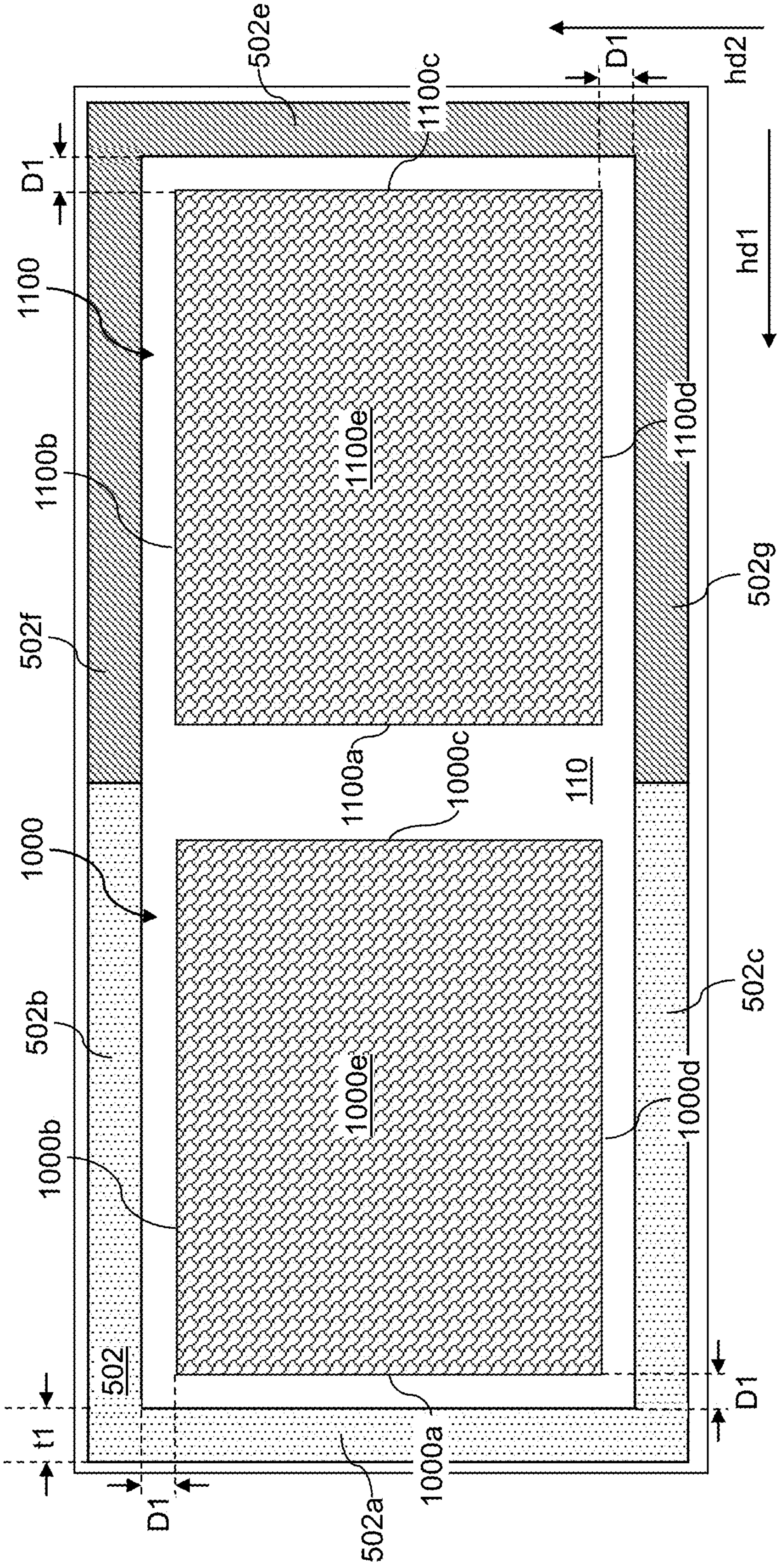

FIGS. 4A and 4B are various views of a second alternative structure after attaching a shield according to an embodiment of the present disclosure. FIG. 4A is a vertical cross-sectional view and FIG. 4B is a horizontal cross-sectional view along the horizontal plane C-C' of FIG. 4A. Referring to FIGS. 4A and 4B, a shield 502 may be formed using more than one MI and EMI resistant materials. The shield 502 may be formed to have sidewalls (e.g., 502*a*, 502*b*, 502*c*, 502*e*, 502*f*, 502*g*), and a ceiling including ceiling portions 502*d*, 502*h*. The sidewalls 502*a*-502*c* and the ceiling portion 502*d* may be a different material than the sidewalls 502*e*-502*g* and the ceiling portion 502*h*. For example, the chip package structure 1000 may be an MRAM susceptible to MI and the chip package structure 1100 may be an RF device susceptible to EMI. Thus, to optimize regional protection around each of the chip package structures 1000, 1100, the shield 502 may include various MI and EMI materials. For example, the sidewalls 502*a*-502*c* and the ceiling portion 502*d* may be formed from Si steel that has stronger protections against MI, and the sidewalls 502*e*-502*g* and the ceiling portion 502*h* may be formed from Mu-metal that has stronger protections against EMI.

In some embodiments, the portions of the shield 502 including different materials may be affixed or otherwise attached to each other through any conventional means, such as molding and welding, or via an adhesive layer between the different-material portions. For example, the sidewall 502*b* may be welded or affixed to the sidewall 502*f*, the sidewall 502*c* may be welded or affixed to the sidewall 502*g*, and the ceiling portion 502*d* may be welded or affixed to the ceiling portion 502*h*. In some embodiments, the shield 502 may include a slotted frame including slotted openings in which shield plates may be inserted to form the fully encapsulating shield 502. In some embodiments, the shield 502 may be molded or otherwise formed to be one solid, continuous piece having regional portions including different materials for optimized MI and EMI protection.

Figure 5:
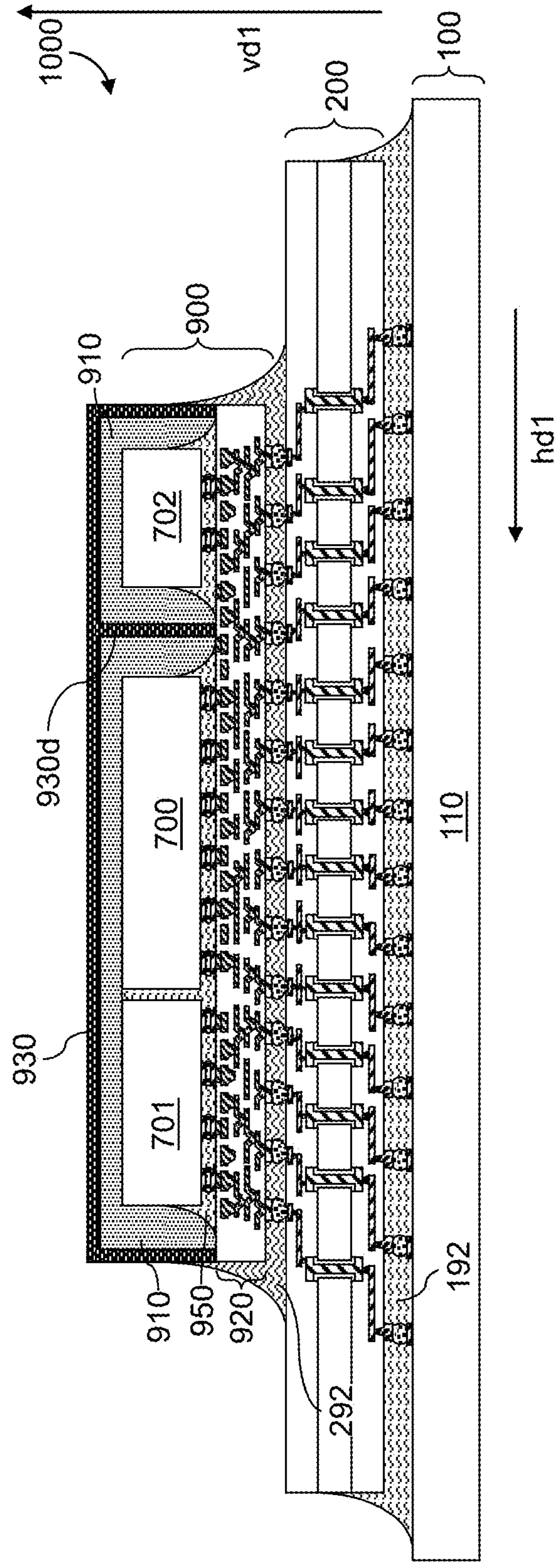
FIG. 5 is a vertical cross-sectional view of a third alternative structure after forming a shield according to an embodiment of the present disclosure.

FIG. 5 is a vertical cross-sectional view of a third alternative structure after forming a shield according to an embodiment of the present disclosure. Referring to FIG. 5, a package-level shield 930 may be formed within a chip package structure 1000. In the embodiment of FIG. 5, each individual semiconductor die 700, 701, 702 may be referred to as its own chip package structure. The package-level shield 930 may be formed around the molding compound die frame 910. The package-level shield 930 may include a material such as Si steel or Mu-metal to provide both MI and EMI protection to the semiconductor dies 700, 701, 702. The package-level shield 930 may include a divider portion 930*d* which may isolate semiconductor dies and may be positioned between proximate sidewalls of the semiconductor die 700 and the semiconductor die 702. For example, the semiconductor die 700 may be an SoC, the semiconductor die 701 may be an MRAM, the semiconductor die 702 may be an RF device, the package-level shield may encapsulate the semiconductor dies 700, 701, 702, and the divider portion 930*d* may isolate the semiconductor die 702 from the semiconductor dies 700, 701.

Figure 6:
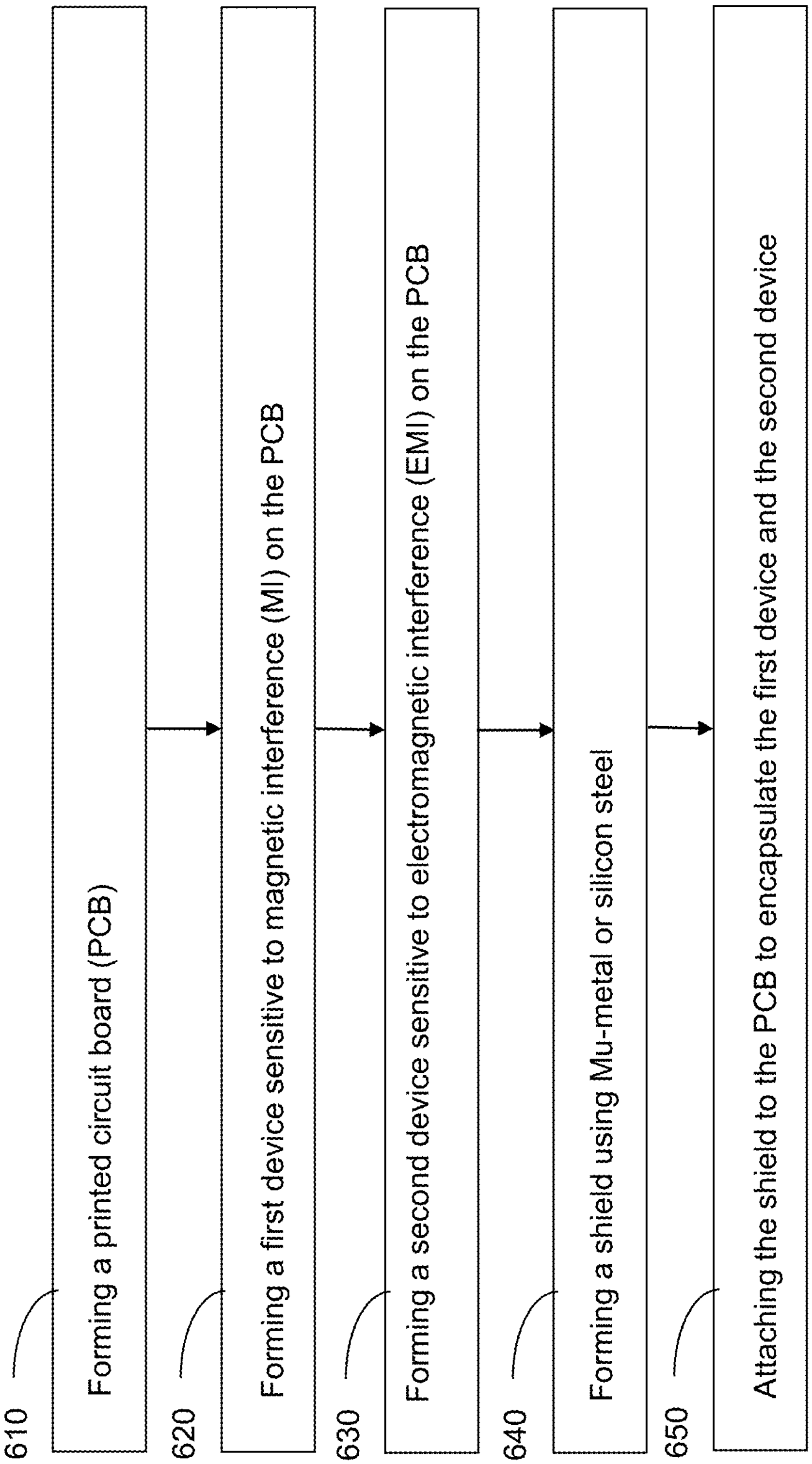
FIG. 6 is a flowchart illustrating steps for forming an exemplary structure according to an embodiment of the present disclosure.

Referring to FIG. 6, a flowchart illustrates steps for forming an exemplary structure according to an embodiment of the present disclosure.

Referring to step 610 and FIGS. 1A and 1B, a printed circuit board 100 may be formed.

Referring to step 620 and FIGS. 1A and 1B, a first device sensitive (e.g., 700, 701, 702, 1000, 1100) to magnetic interference (MI) on the PCB may be formed.

Referring to step 630 and FIGS. 1A and 1B, a second device (e.g., 700, 701, 702, 1000, 1100) sensitive to electromagnetic interference (EMI) on the PCB may be formed.

Referring to step 640 and FIGS. 2A-5, a shield (e.g., 500, 501, 502, 930) may be formed using Mu-metal or silicon steel. In some embodiments, forming the shield (e.g., 500, 501, 502, 930) using Mu-metal or silicon steel may include forming a first sidewall (e.g., 501*a*-501*c*, 501*e*-501*g*) having a first thickness (e.g., t1, t4), forming a second sidewall (e.g., 501*a*-501*c*, 501*e*-501*g*) having a second thickness (e.g., t1, t4) that is different from the first thickness, forming a first ceiling portion (e.g., 501*d*, 501*h*) having a third thickness (e.g., t2, t3), in which the first ceiling portion is connected to the first sidewall, and forming a second ceiling portion (e.g., 501*d*, 501*h*) having a fourth thickness (e.g., t2, t3) that is different from the third thickness, in which the second ceiling portion may be connected to the first ceiling portion and the second sidewall. In some embodiments, a first distance D1 between a first sidewall (e.g., 500*a*-500*c*) of the shield and a proximate sidewall (e.g., 1000*a*, 1000*b*, 1000*d*) of the first device (e.g., 701, 1000) may be in a range of 0.01 to 5 millimeters, a second distance D2 between a first ceiling portion (e.g., 500*d*) of the shield and a top surface (e.g., 1000*e*) of the first device may be greater than 0.1 millimeters, a third distance D3 between a second ceiling portion (e.g., 500*h*) of the shield and a top surface (e.g., 1100*e*) of the second device may be greater than 0.1 millimeters, and a fourth distance D4 between a second sidewall (e.g., 500*e*-500*g*) of the shield and a sidewall of the second device (e.g., 1100*b*-1100*d*) may be in a range of 0.01 to 10 millimeters.

Referring to step 650 and FIGS. 2A-5, the shield (e.g., 500, 501, 502, 930) may be attached to the PCB to encapsulate the first device and the second device (e.g., 700, 701, 702, 1000, 1100).

Referring to all drawings and according to various embodiments of the present disclosure, a shielding assembly (e.g., 1200) is provided, which may include: a first chip package structure (e.g., 1000, 1100) sensitive to magnetic interference (MI), a second chip package structure (e.g., 1000, 1100) sensitive to electromagnetic interference (EMI), and a shield (e.g., 500, 501, 502, 930) surrounding sidewalls (e.g., 1000_a_-1000_d_, 1100_a_-1100_d_) and top surfaces (e.g., 1000_e_, 1100_e_) of the first chip package structure and the second chip package structure, in which the shield is a magnetic shielding material. In some embodiments, the first chip package structure may be a magnetoresistive random-access memory (MRAM) device and the second chip package structure may be a radio frequency device.

In some embodiments, the magnetic shielding material (e.g., 500, 501, 502, 930) may include silicon steel. In some embodiments, the magnetic shielding material may include 6.5% silicon. In some embodiments, the magnetic shielding material may include Mu-metal material. In some embodiments, the shield may include 70% to 80% nickel (Ni) and 10% to 25% iron (Fe). In some embodiments, the magnetic shielding material may include less than or equal to 5% copper (Cu). In some embodiments, the magnetic shielding material may include less than or equal to 5% molybdenum (Mo). In some embodiments, the magnetic shielding material may include less than or equal to 5% chromium (Cr). In some embodiments, the shield may have a thickness greater than 0.1 millimeters.

In some embodiments, the shield (e.g., 500, 501, 502, 930) may include sidewalls (e.g., 500_a_-500_d_, 501_a_-501_c_, 501_e_-501_g_, 502_a_-502_c_, 502_e_-502_g_) and a ceiling (e.g., 500_e_, ceiling portions (e.g., 501_d_, 501_h_, 502_d_, 502_h_)), connected to the sidewalls, in which the sidewalls and the ceiling have thicknesses (e.g., t1, t2, t3, t4) in a range between 0.1 millimeters and 1 millimeter.

In some embodiments, the shield (e.g., 500, 501, 502, 930) may include a first sidewall (e.g., 501_a_-501_c_, 502_a_-502_c_) proximate to and parallel with a sidewall (e.g., 1000_a_, 1000_b_, 1000_c_) of the first chip package structure, a second sidewall (e.g., 501_e_-501_g_, 502_e_-502_g_) proximate to and parallel with a sidewall (e.g., 1100_b_-1100_d_) of the second chip package structure, and a ceiling connecting the first sidewall and the second sidewall, the ceiling including a first ceiling portion (e.g., 501_d_, 502_d_) proximate to and parallel with a top surface (e.g., 1000_e_) of the first chip package structure, in which the first ceiling portion may be connected to the first sidewall, and a second ceiling portion (e.g., 501_h_, 502_h_) proximate to and parallel with a top surface (e.g., 1100_e_) of the second chip package structure, in which the second ceiling portion may be connected to the first ceiling portion and the second sidewall. In some embodiments, a first distance D1 between the first sidewall and the sidewall of the first chip package structure may be in a range of 0.01 to 5 millimeters, a second distance D2 between the first ceiling portion and the top surface of the first chip package structure may be greater than 0.1 millimeters, a third distance D3 between the second ceiling portion and the top surface of the second chip package structure may be greater than 0.1 millimeters, and a fourth distance D4 between the second sidewall and the sidewall of the second chip package structure may be in a range of 0.01 to 10 millimeters. In some embodiments, the first sidewall and the first ceiling portion may be a different material than the second sidewall and the second ceiling portion.

In some embodiments, the first chip package structure (e.g., 700, 701), the second chip package structure (e.g., 702), and the shield may be within a same chip package structure (e.g., 1000, 1100), in which the shield is a package-level shield 930, and in which the shield includes a divider portion 930_d_ that is positioned between proximate sidewalls of the first chip package structure and the second chip package structure.

Referring to all drawings and according to various embodiments of the present disclosure, a shield (e.g., 500, 501, 502, 930) is provided, which may include: Mu-metal or silicon steel, a first sidewall (e.g., 501_a_-501_c_) having a first thickness t1, a second sidewall (e.g., 501_e_-501_g_) having a second thickness t4 that is different from the first thickness, and a ceiling connecting the first sidewall and the second sidewall, the ceiling including: a first ceiling portion (e.g., 501_d_) having a third thickness t2, in which the first ceiling portion is connected to the first sidewall, and a second ceiling portion (e.g., 501_h_) having a fourth thickness t3 that is different from the third thickness, in which the second ceiling portion is connected to the first ceiling portion and the second sidewall. In some embodiments, the first thickness may be in a range of 0.1 to 1 millimeter, the second thickness may be in a range of 0.2 to 1 millimeter, the third thickness may be in a range of 0.1 to 0.4 millimeters, and the fourth thickness may be in a range of 0.1 to 1 millimeter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shielding assembly, comprising:
- a first chip package structure sensitive to magnetic interference (MI);
- a second chip package structure sensitive to electromagnetic interference (EMI); and
- a shield surrounding sidewalls and top surfaces of the first chip package structure and the second chip package structure, wherein the shield comprises a magnetic shielding material comprising Mu-metal material, and wherein the magnetic shielding material further comprises silicon steel comprising 6.5% silicon.

2. The shielding assembly of claim 1, wherein the magnetic shielding material further comprises 70% to 80% nickel (Ni) and 10% to 25% iron (Fe).

3. The shielding assembly of claim 2, wherein the magnetic shielding material comprises less than or equal to 5% copper (Cu).

4. The shielding assembly of claim 2, wherein the magnetic shielding material comprises less than or equal to 5% molybdenum (Mo).

5. The shielding assembly of claim 2, wherein the magnetic shielding material comprises less than or equal to 5% chromium (Cr).

6. The shielding assembly of claim 1, wherein the shield has a thickness greater than 0.1 millimeters.

7. The shielding assembly of claim 1, wherein the shield comprises sidewalls and a ceiling connected to the sidewalls, and wherein the sidewalls and the ceiling have thicknesses in a range between 0.1 millimeters and 1 millimeter.

8. The shielding assembly of claim 1, wherein the shield comprises:
- a first sidewall proximate to and parallel with a sidewall of the first chip package structure;
- a second sidewall proximate to and parallel with a sidewall of the second chip package structure; and a ceiling connecting the first sidewall and the second sidewall, the ceiling comprising:
a first ceiling portion proximate to and parallel with a top surface of the first chip package structure, wherein the first ceiling portion is connected to the first sidewall; and
a second ceiling portion proximate to and parallel with a top surface of the second chip package structure, wherein the second ceiling portion is connected to the first ceiling portion and the second sidewall.

9. The shielding assembly of claim 8, wherein:
a first distance between the first sidewall and the sidewall of the first chip package structure is in a range of 0.01 to 5 millimeters,
a second distance between the first ceiling portion and the top surface of the first chip package structure is greater than 0.1 millimeters,
a third distance between the second ceiling portion and the top surface of the second chip package structure is greater than 0.1 millimeters, and
a fourth distance between the second sidewall and the sidewall of the second chip package structure is in a range of 0.01 to 10 millimeters.

10. The shielding assembly of claim 8, wherein the first sidewall and the first ceiling portion are a different material than the second sidewall and the second ceiling portion.

11. The shielding assembly of claim 8, wherein the first chip package structure, the second chip package structure, and the shield are within a same chip package structure, wherein the shield is a package-level shield, and wherein the shield comprises a divider portion that is positioned between proximate sidewalls of the first chip package structure and the second chip package structure.

12. The shielding assembly of claim 1, wherein the first chip package structure is a magnetoresistive random-access memory (MRAM) device and the second chip package structure is a radio frequency device.

13. A shield comprising:
Mu-metal or silicon steel;
a first sidewall having a first thickness;
a second sidewall having a second thickness that is different from the first thickness; and
a ceiling connecting the first sidewall and the second sidewall, the ceiling comprising:
a first ceiling portion having a third thickness, wherein the first ceiling portion is connected to the first sidewall; and
a second ceiling portion having a fourth thickness that is different from the third thickness, wherein the second ceiling portion is connected to the first ceiling portion and the second sidewall, wherein the first sidewall and the first ceiling portion are a different material than the second sidewall and the second ceiling portion.

14. The shield of claim 13, wherein:
the first thickness is in a range of 0.1 to 1 millimeter,
the second thickness is in a range of 0.2 to 1 millimeter,
the third thickness is in a range of 0.1 to 0.4 millimeters, and
the fourth thickness is in a range of 0.1 to 1 millimeter.

15. A method of forming a shielding assembly, comprising:
forming a printed circuit board (PCB);
forming a first chip package structure sensitive to magnetic interference (MI) on the PCB;
forming a second chip package structure sensitive to electromagnetic interference (EMI) on the PCB;
forming a shield using Mu-metal or silicon steel; and
attaching the shield to the PCB to encapsulate the first chip package structure and the second chip package structure, wherein a first sidewall and a first ceiling portion of the shield are a different material than a second sidewall and a second ceiling portion of the shield.

16. The method of claim 15, wherein forming the shield using Mu-metal or silicon steel further comprises:
forming the first sidewall having a first thickness;
forming the second sidewall having a second thickness that is different from the first thickness;
forming the first ceiling portion having a third thickness, wherein the first ceiling portion is connected to the first sidewall; and
forming the second ceiling portion having a fourth thickness that is different from the third thickness, wherein the second ceiling portion is connected to the first ceiling portion and the second sidewall.

17. The method of claim 15, wherein:
a first distance between a first sidewall of the shield and a proximate sidewall of the first chip package structure is in a range of 0.01 to 5 millimeters,
a second distance between a first ceiling portion of the shield and a top surface of the first chip package structure is greater than 0.1 millimeters,
a third distance between a second ceiling portion of the shield and a top surface of the second chip package structure is greater than 0.1 millimeters, and
a fourth distance between a second sidewall of the shield and a sidewall of the second chip package structure is in a range of 0.01 to 10 millimeters.

18. The shielding assembly of claim 1, further comprising a printed circuit board (PCB) positioned beneath the first chip package structure and the second chip package structure, the PCB comprising a ground plane.

19. The shield of claim 13, wherein the first thickness is less than the second thickness, and the third thickness is less than the fourth thickness.

20. The method of claim 15, wherein attaching the shield to the PCB comprises soldering the shield to a ground plane within the PCB positioned beneath the first chip package structure and the second chip package structure.

* * * * *